(12) United States Patent
Kasuga et al.

(10) Patent No.: US 9,319,609 B2
(45) Date of Patent: Apr. 19, 2016

(54) SOLID-STATE IMAGING DEVICE

(71) Applicant: Panasonic Intellectual Property Management Co., Ltd., Osaka (JP)

(72) Inventors: Shigetaka Kasuga, Osaka (JP); Motonori Ishii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/578,560

(22) Filed: Dec. 22, 2014

(65) Prior Publication Data

US 2015/0103219 A1    Apr. 16, 2015

Related U.S. Application Data

(63) Continuation of application No. PCT/JP2013/001607, filed on Mar. 12, 2013.

(30) Foreign Application Priority Data

Jun. 27, 2012  (JP) ................................ 2012-144690

(51) Int. Cl.
*H04N 5/335*       (2011.01)
*H04N 5/3745*      (2011.01)
*H04N 5/363*       (2011.01)
(Continued)

(52) U.S. Cl.
CPC ............. *H04N 5/3745* (2013.01); *H04N 5/363* (2013.01); *H04N 5/378* (2013.01); *H01L 27/14643* (2013.01)

(58) Field of Classification Search
CPC .............................. H04N 5/3745; H04N 5/378
See application file for complete search history.

(56) References Cited

U.S. PATENT DOCUMENTS 4,363,963 A    12/1982  Ando
6,330,303 B1   12/2001  Yamane et al.
(Continued)

FOREIGN PATENT DOCUMENTS

JP    55-120182    9/1980
JP    10-281870    10/1998
(Continued)

OTHER PUBLICATIONS

International Search Report issued Apr. 16, 2013 in International (PCT) Application No. PCT/JP2013/001607.
(Continued)

*Primary Examiner* — Tuan Ho
*Assistant Examiner* — Fayez Bhuiyan
(74) *Attorney, Agent, or Firm* — Wenderoth, Lind & Ponack, L.L.P.

(57)    ABSTRACT

A pixel unit included in a sensor chip includes: a first pixel connected to a first feedback amplifier which is connected to a first column signal line as an input line and a first reset drain line as an output line; and a second pixel connected to a second feedback amplifier which is connected to a second column signal line as an input line and a second reset drain line as an output line. A drain of a reset transistor of the first pixel is connected to the first reset drain line, a drain of a reset transistor of the second pixel is connected to the second reset drain line, a source of an amplifying transistor of the first pixel is connected to the first column signal line, and a source of an amplifying transistor of the second pixel is connected to the second column signal line.

7 Claims, 13 Drawing Sheets

(51) Int. Cl.
*H04N 5/378* (2011.01)
*H01L 27/146* (2006.01)

(56) References Cited

U.S. PATENT DOCUMENTS

| | | | |
|---|---|---|---|
| 6,469,740 | B1 | 10/2002 | Kuroda et al. |
| 6,777,660 | B1* | 8/2004 | Lee .................. H01L 27/14609 250/208.1 |
| 8,363,133 | B2 | 1/2013 | Hara |
| 8,659,339 | B2 | 2/2014 | Jung et al. |
| 2010/0271523 | A1 | 10/2010 | Hara |
| 2011/0273598 | A1 | 11/2011 | Ogino et al. |
| 2012/0104235 | A1* | 5/2012 | Sumi .................. H04N 5/243 250/208.1 |
| 2012/0133800 | A1 | 5/2012 | Jung et al. |
| 2012/0200752 | A1 | 8/2012 | Matsunaga |
| 2014/0085523 | A1* | 3/2014 | Hynecek .......... H01L 27/14605 348/311 |
| 2015/0054973 | A1* | 2/2015 | Velichko .............. H04N 5/369 348/218.1 |

FOREIGN PATENT DOCUMENTS

| | | |
|---|---|---|
| JP | 2000-165747 | 6/2000 |
| JP | 2007-060350 | 3/2007 |
| JP | 2009-212603 | 9/2009 |
| JP | 2011-239156 | 11/2011 |
| JP | 2012-114838 | 6/2012 |
| JP | 2012-120168 | 6/2012 |
| WO | 2009/090719 | 7/2009 |
| WO | 2011/058684 | 5/2011 |

OTHER PUBLICATIONS

Les Kozlowski et. al., International Solid-State Circuits Conference 2005 / Session 19 / Imagers / 19.7.

B. Pain et. al., "Reset Noise Suppression in Two-Dimensional CMOS Photodiode Pixels through Column-based Feedback-Reset", 2002 IEEE, 2002.

* cited by examiner

Double-input type circuit

Single-input type circuit

SOLID-STATE IMAGING DEVICE

CROSS REFERENCE TO RELATED APPLICATION

This is a continuation application of PCT International Application No. PCT/JP2013/001607 filed on Mar. 12, 2013, designating the United States of America, which is based on and claims priority of Japanese Patent Application No. 2012-144690 filed on Jun. 27, 2012. The entire disclosures of the above-identified applications, including the specifications, drawings and claims are incorporated herein by reference in their entirety.

FIELD

The present disclosure relates to a solid-state imaging device and particularly to a technique which improves image quality while speeding up a frame rate by reducing a noise of an image sensor which directly detects a potential from a photoelectric conversion unit such as a layered film.

BACKGROUND

A layered solid-state imaging device as disclosed in Patent Literature (PTL) 1 is known as a solid-state imaging device in which no photoelectric conversion unit is provided for a semiconductor substrate. The layered solid-state imaging device allows securing a greater light receiving area and capacity of the photoelectric conversion unit even in a miniaturized pixel, and thus can achieve a larger saturated signal amount.

In a solid-state imaging device, it is required to reset signal charges of pixels for each frame. Here, if a reset pulse being turned OFF has a sharp pulse shape, it is randomly determined to which of a source and a drain of a reset transistor the charges on a channel moves, and the pulse shape appears as a large random noise. Specifically, there is a problem of occurrence of a kTC noise due to a thermal noise from the reset transistor in the pixel, which deteriorates the image quality.

The following techniques can remove the kTC noise: a soft reset technique in which a reset transistor is turned OFF gradually as disclosed in Non Patent Literature (NPL) 1, and a technique in which a single feedback amplifier is connected to each column as disclosed in PTL 2 and NPL 2.

CITATION LIST

Patent Literature

[PTL 1] Japanese Unexamined Patent Application Publication No. 55-120182
[PTL 2] Japanese Unexamined Patent Application Publication No. 10-281870

Non Patent Literature

[NPL 1] International Solid-State Circuits Conference 2005, 19.7
[NPL 2] international Electron Devices Meeting 2002, 32.5

SUMMARY

Technical Problem

However, in the soft reset technique in which a reset transistor in a pixel is turned OFF gradually (NPL 1) and the technique in which a single feedback amplifier is connected to each column (PTL 2 and NPL 2), the kTC noise is reduced in proportion to the reset time, which requires a longer pixel read time. Furthermore, when a single feedback amplifier is adopted, it is impossible to reset a pixel signal read row and an electronic shutter row in parallel. Therefore, it is difficult to achieve a high-speed frame rate required for continuous image capturing or video capturing with higher pixel count.

In view of the above problems, the present disclosure provides a solid-state imaging device that achieves a high-speed frame rate required for continuous image capturing or video capturing with higher pixel count.

Solution to Problem

A solid-state imaging device according to an aspect of the present disclosure includes: a pixel unit including a plurality of pixels arranged in a matrix; a first column signal line and a second column signal line which are provided for each column of the pixel unit; a first reset drain line and a second reset drain line which are provided for each column of the pixel unit; a first feedback amplifier which is provided for each column of the pixel unit and connected to the first column signal line as an input line and the first reset drain line as an output line; and a second feedback amplifier which is provided for each column of the pixel unit and connected to the second column signal line as an input line and the second reset drain line as an output line, wherein the pixel unit includes: a first connection-type pixel connected to the first feedback amplifier; and a second connection-type pixel connected to the second feedback amplifier, the first connection-type pixel includes a reset transistor having a source and a drain one of which is connected to the first reset drain line, the second connection-type pixel includes a reset transistor having a source and a drain one of which is connected to the second reset drain line, the first connection-type pixel includes an amplifying transistor having a source and a drain one of which is connected to the first column signal line, and the second connection-type pixel includes an amplifying transistor having a source and a drain one of which is connected to the second column signal line.

Advantageous Effects

With the solid-state imaging device according to the present disclosure, reduction of a noise in a pixel is achieved which allows continuous image capturing or video capturing with higher pixel count brought by a high-speed frame rate.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Figure 1:
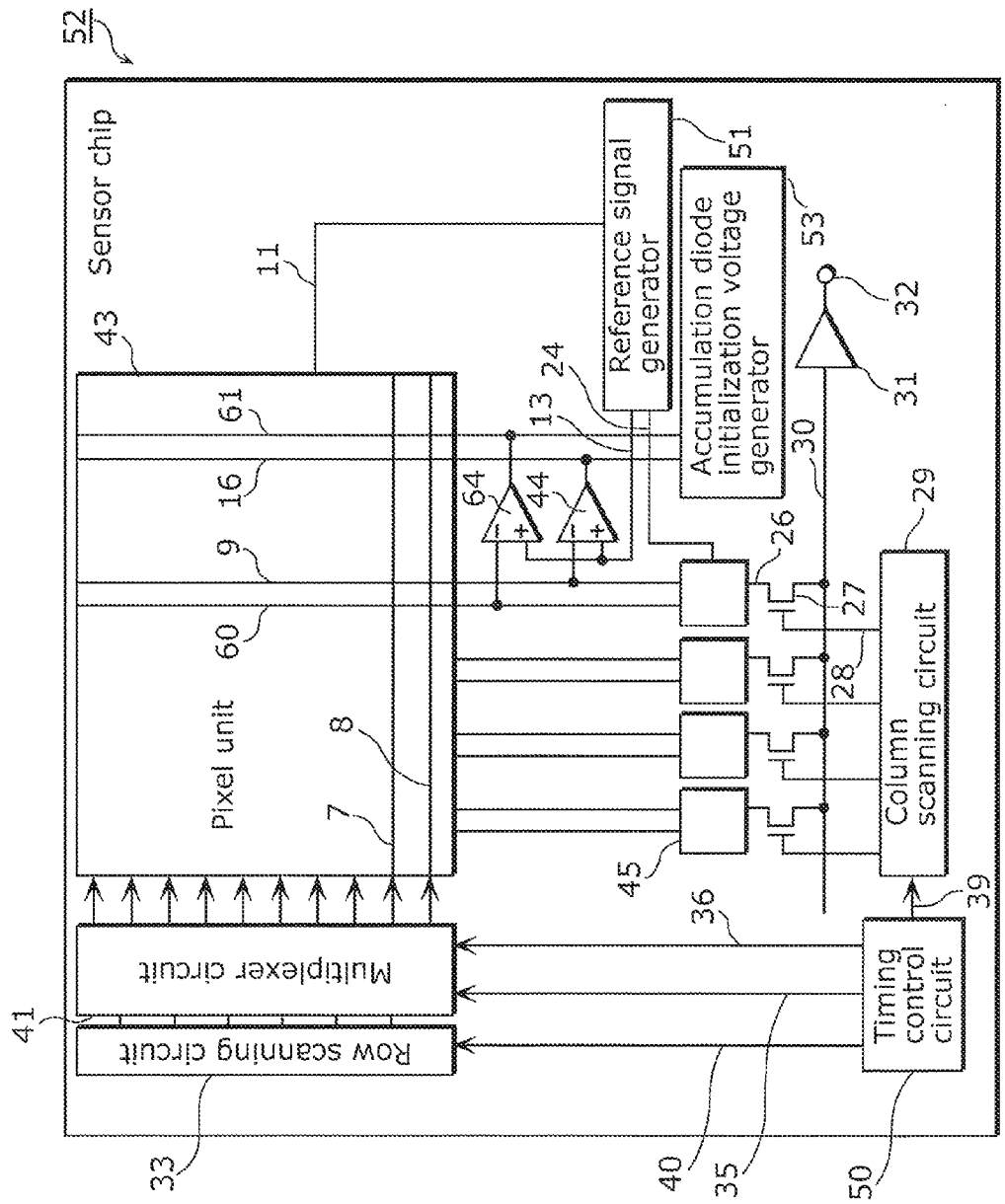
FIG. 1 is a diagram indicating a circuit configuration of a layered solid-state imaging device according to Embodiment 1.

Hereinafter, description is provided on a solid-state imaging device and a camera system according to the present embodiment with reference to the Drawings.

In the Drawings, the elements representing substantially the same configuration, operation, and effect may be given the same reference numerals. Furthermore, the relation of connection between the constituent elements is an example for illustrating the present disclosure specifically, and thus the relation of connection for achieving the functions of the present disclosure is not limited to this relation. Moreover, although the source and the drain of an FET have the same structure and function in most of the cases and thus they are not discerned clearly, the side to which signals are inputted is referred to as a drain and a side from which the signals are outputted is referred to as a source in the description below to facilitate explanation.

Embodiment 1

Hereinafter, Embodiment 1 is described with reference to the Drawings.

FIG. 1 is a diagram indicating a circuit configuration of a layered solid-state imaging device according to Embodiment 1. As illustrated in FIG. 1, the solid-state imaging device, that is a sensor chip 52, includes: a pixel reset signal line 7, a pixel selection signal line 8, a first column signal line 9, a second column signal line 60, a first reset drain line 16, a second reset drain line 61, a first feedback amplifier 44, a second feedback amplifier 64, a correlated double sampling (CDS) circuit 45, a column selection transistor 27, a column scanning circuit (horizontal scanning unit) 29, a horizontal signal line 30, an output amplifier 31, a row scanning circuit (vertical scanning unit) 33, a multiplexer circuit (MUX) 41, a VOUT terminal 32, a pixel unit 43, a timing control circuit 50, a reference signal generator 51, and an accumulation diode initialization voltage generator 53.

In the sensor chip 52, the pixel unit 43 is selected by the row scanning circuit 33 and the multiplexer circuit 41.

The row scanning circuit 33 supplies various timing signals to the pixel unit 43 via the pixel reset signal line 7 and the pixel selection signal line 8. The pixel reset signal line 7 is a signal line for transmitting reset signals, and is provided for each row to reset the signals of pixels of a corresponding row by the reset transistor 3. The accumulation diode initialization voltage generator 53 supplies a reset potential to each reset drain line.

The multiplexer circuit 41 controls output, to the pixel unit 43, of a row selection signal 35 and a pixel reset control signal 36 provided from the timing control circuit 50. The multiplexer circuit 41 is provided between the timing control circuit 50 and the pixel unit 43, selectively supplies the pixel reset control signal 36 to a pixel reset signal line 7 corresponding to a predetermined row, and selectively supplies the row selection signal 35 to a pixel selection signal line 8 corresponding to the predetermined row.

The timing control circuit 50 supplies a vertical scanning signal 40 to the row scanning circuit 33, supplies the row selection signal 35 and the pixel reset control signal 36 to the multiplexer circuit 41, and supplies a horizontal scanning signal 39 to the column scanning circuit 29.

The column scanning circuit 29 supplies the column selection transistor 27 with the column selection signal 28 to cause the column selection transistor 27 to sequentially read the signals of the pixel unit 43 out to the horizontal signal line 30. The output amplifier 31 amplifies signals transmitted via the horizontal signal line 30 and outputs the amplified signals to the VOUT terminal 32.

The first feedback amplifier 44 has: an input terminal connected to a first column signal line 9 and a reference signal line 13; and an output terminal connected to a first reset drain line 16, and outputs a signal obtained by inversely-amplifying an input signal. The second feedback amplifier 64 has: an input terminal connected to a second column signal line 60 and the reference signal line 13; and an output terminal connected to a second reset drain line 61, and outputs a signal obtained by inversely-amplifying an input signal.

The reference signal generator 51 is a circuit which generates a reference signal for use in comparison with an input signal from the first column signal line 9 and an input signal from the second column signal line 60 at the feedback amplifier 44 and the feedback amplifier 64, respectively, and inputs the generated reference signals to the feedback amplifiers 44 and 64 via the reference signal line 13.

Figure 2:
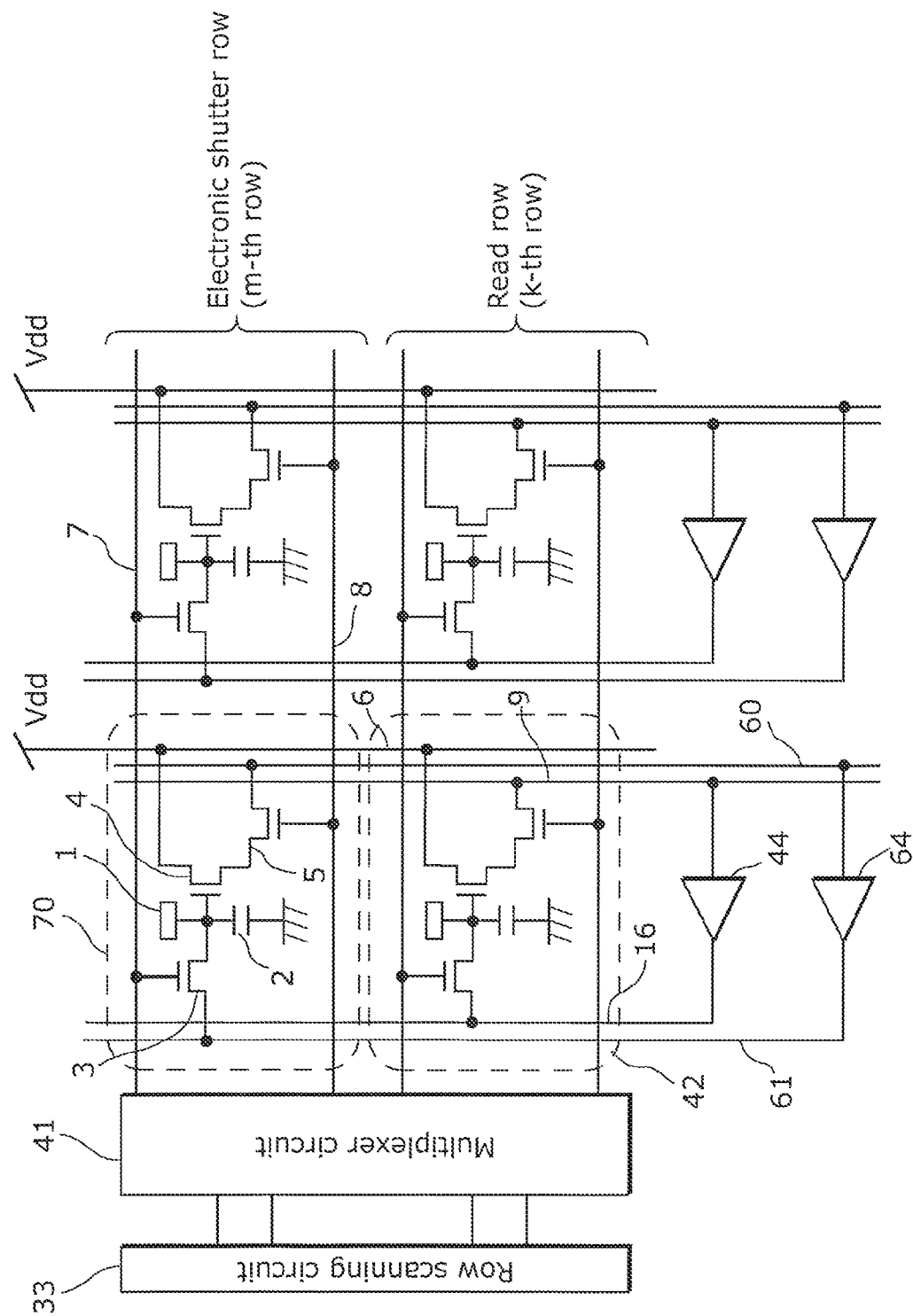
FIG. 2 is a diagram indicating details of configurations of a pixel unit and a peripheral circuit of the solid-state imaging device according to Embodiment 1.

FIG. 2 is a diagram indicating details of configurations of a pixel unit and a peripheral circuit of the solid-state imaging device according to Embodiment 1. Although FIG. 2 includes "two rows and two columns" of the pixel unit 43 to indicate the circuit of the pixel unit 43 in FIG. 1 in more detail, the number of rows and columns of the pixel unit 43 may be set as desired. In the pixel unit 43, plural pixels are arranged in a matrix on the semiconductor substrate and the first column signal line 9 and the second column signal line 60 are provided for each column.

The pixel unit 43 includes a first connection-type pixel 42 connected to the first feedback amplifier 44 and a second connection-type pixel 70 connected to the second feedback amplifier 64. The pixel 42 is arranged in a k-th row which is a read row, and the pixel 70 is arranged in a m-th row which is an electronic shutter row.

The pixel 42 and the pixel 70 each includes: a photoelectric conversion unit 1 that converts light into a signal charge; an accumulation unit 2 that accumulates the signal charge; an amplifying transistor 4 that has a gate connected to the accumulation unit 2 and outputs a voltage signal corresponding to the charge accumulated in the accumulation unit 2; and a selection transistor 5.

In each pixel, a drain of the reset transistor 3 is connected to the reset drain line. A source of the reset transistor 3 is connected to the accumulation unit 2. A source of the selection transistor 5 is connected to the column signal line. A drain of the selection transistor 5 is connected to a source of the amplifying transistor 4. Although the selection transistor 5 is inserted between the source of the amplifying transistor 4 and the column signal line in FIG. 2, the selection transistor 5 may be inserted between the drain of the amplifying transistor 4 and the power line 6.

Figure 3:
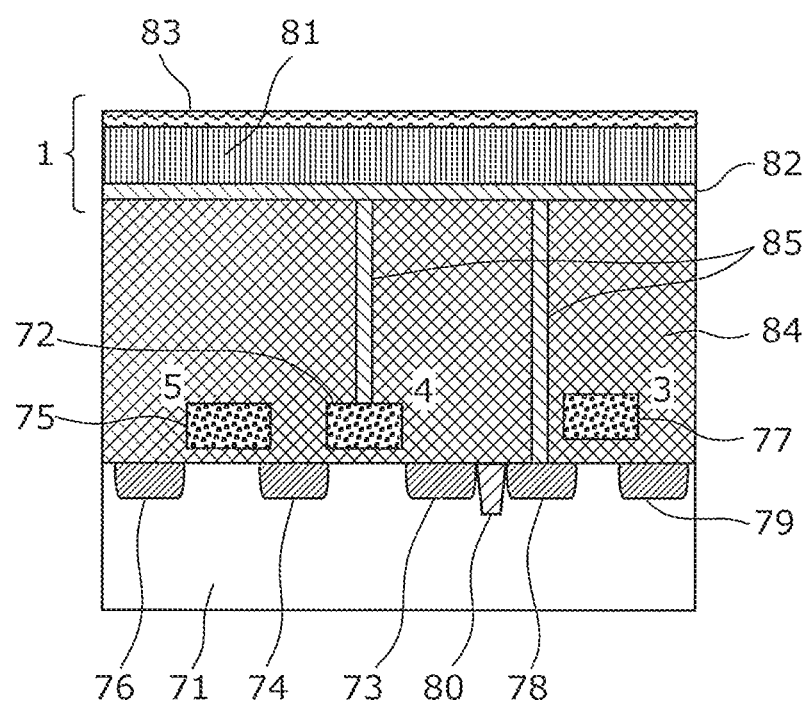
FIG. 3 is a cross-sectional view of a pixel of the solid-state imaging device according to Embodiment 1.

FIG. 3 is a cross-sectional view of a pixel of the solid-state imaging device according to Embodiment 1. An amplifying transistor 4, a selection transistor 5, and a reset transistor 3 are formed on a semiconductor substrate 71 comprising silicon. The amplifying transistor 4 has a gate electrode 72, a diffusion layer 73 which is one of a source and a drain, and a diffusion layer 74 which is the other of the source and the drain. The selection transistor 5 has a gate electrode 75, a diffusion layer 74 which is one of a source and a drain, and a diffusion layer 76 which is the other of the source and the drain. The amplifying transistor 4 and the selection transistor 5 share the diffusion layer 74. The reset transistor 3 has a gate electrode 77, a diffusion layer 78 which is one of a source and a drain, and a diffusion layer 79 which is the other of the source and the drain. The diffusion layer 73 and the diffusion layer 78 are isolated by an element isolation region 80.

On the semiconductor substrate 71, an insulator 84 is formed to cover each transistor. On the insulator 84, a photoelectric conversion unit 1 is formed. The photoelectric conversion unit 1 includes a photoelectric conversion film 81, a pixel electrode 82, and a transparent electrode 83. The photoelectric conversion film 81 is formed above the semiconductor substrate 71 and comprises an organic material, amorphous silicon, or the like. The pixel electrode 82 is formed on a side, which is closer to the semiconductor substrate 71, of the photoelectric conversion film 81. The transparent electrode 83 is formed on a side, which is opposite the pixel electrode 82, of the photoelectric conversion film 81.

The pixel electrode 82 is connected to the gate electrode 72 of the amplifying transistor 4 and the diffusion layer 78 of the reset transistor 3, via the contacts 85. The diffusion layer 78 connected to the pixel electrode 82 functions as the accumulation unit 2.

Next, description is provided on detailed configurations of the peripheral circuits according to Embodiment 1.

Figure 4:
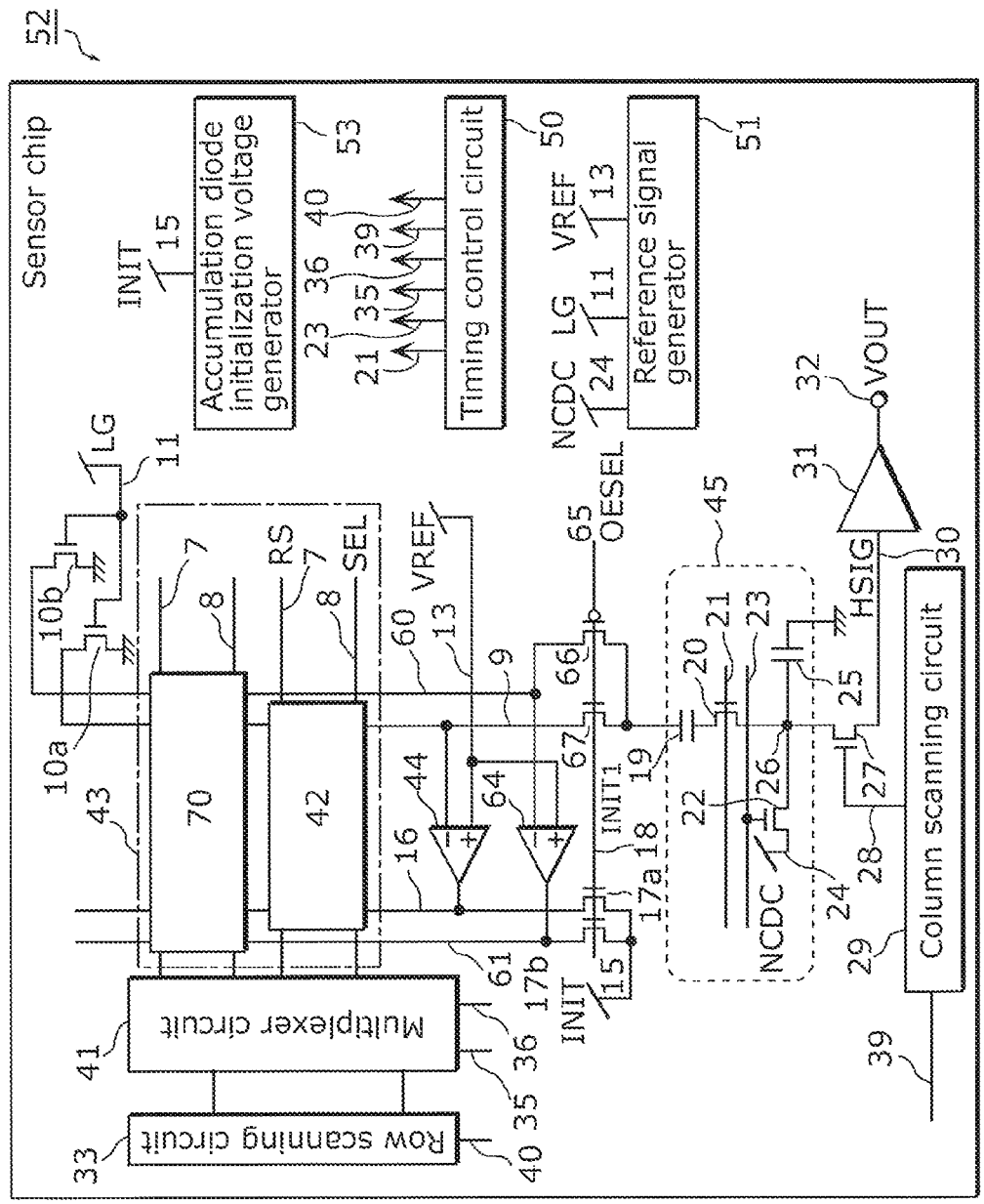
FIG. 4 is a diagram indicating an example of details of the peripheral circuit configuration of the solid-state imaging device according to Embodiment 1.

FIG. 4 is a diagram indicating an example of details of a peripheral circuit configuration of the solid-state imaging device according to Embodiment 1. As illustrated in FIG. 4, a CDS circuit 45 according to Embodiment 1 is connected to the column signal line selected by the column signal line switch control signal 65 out of the first column signal line 9 and the second column signal line 60. A CDS output node 26 outputs a signal corresponding to a difference between potentials at two arbitral timings, which are different from each other, at a corresponding column signal line. More specifically, the difference is of (i) a potential at reset operation (a potential of a column signal line when the reset transistor 3 is ON) and (ii) a potential at signal output operation (a potential of a column signal line when the reset transistor 3 is OFF).

Furthermore, the CDS circuit 45 includes: capacitors 19 and 25; a sample transistor 20 which is turned ON/OFF by a sample transistor control signal 21; and a clamp transistor 22 which is turned ON/OFF by a clamp transistor control signal 23 and connected to a clamp signal line 24.

The load transistors 10a and 10b are turned ON/OFF by a pixel load transistor control line 11. The first column signal line 9 is connected to a load transistor 10a and the second column signal line 60 is connected to a load transistor 10b.

The reference signal generator 51 has a function to supply a pixel load transistor control signal LG to the pixel load transistor control line 11 and a clamp signal NCDC to the clamp signal line 24.

Description is provided on a cause of the kTC noise and a principle of suppressing the kTC noise in the above circuit configuration.

The photoelectric conversion unit 1 converts light into an electric signal S and the electric signal S is accumulated in the accumulation unit 2. When the selection transistor 5 is turned ON here, the electric signal S is impedance-converted by a source follower circuit and is input to the CDS circuit 45 via the first column signal line 9. The source follower circuit includes the amplifying transistor 4 and one of the load transistors 10a and 10b. Then, the electric signal S is temporarily sampled and held.

Next, a pixel reset control signal 36 is input to the pixel reset signal line 7 in the pixel, and the electric signal S accumulated at the accumulation unit 2 is reset. Here, when the pixel reset control signal 36 is applied in a sharp rectangular wave, the kTC noise caused by the thermal noise is superimposed on the accumulation unit 2.

Specifically, although the electric signal S at the accumulation unit 2 should be reset to a constant value at a signal level of a reset drain line by the pixel reset control signal 36, the signal at the accumulation unit 2 is a signal superimposed with the kTC noise, and the signal is recognized as a random noise in an image.

When the electric signal at the accumulation unit 2 is denoted as N, the electric signal N with the random noise is transmitted to the CDS circuit 45 via the same path as the above-described electric signal S. and the electric signal N is sampled and held here. At this time, the CDS circuit 45 performs operation to differentiate the electric signal S and the electric signal N, and a differential signal of the electric signal S and the electric signal N is output to the CDS output node 26 and is dealt with as a pixel signal P.

As described above, the random noise component remains in the pixel signal P. Then, when the column selection signal 28 from the column scanning circuit 29 turns ON the column selection transistor 27, the pixel signal P is read out to the horizontal signal line 30, amplified by the output amplifier 31, and output to the outside from the VOUT terminal 32.

Since the image quality is low as it is, instead of inputting a constant voltage to the reset drain line, a pixel signal N including the kTC noise is input to the feedback amplifier and an inversely-amplified signal is output and returned to the accumulation unit 2 again, thereby cancelling the kTC noise. Moreover, by performing soft reset operation on the pixel reset control signal 36 of the pixel reset signal line 7 not by a waveform having the sharp rectangular wave but by a waveform having gradual inclination, the amount of occurrence of the kTC noise is suppressed.

Figure 5:
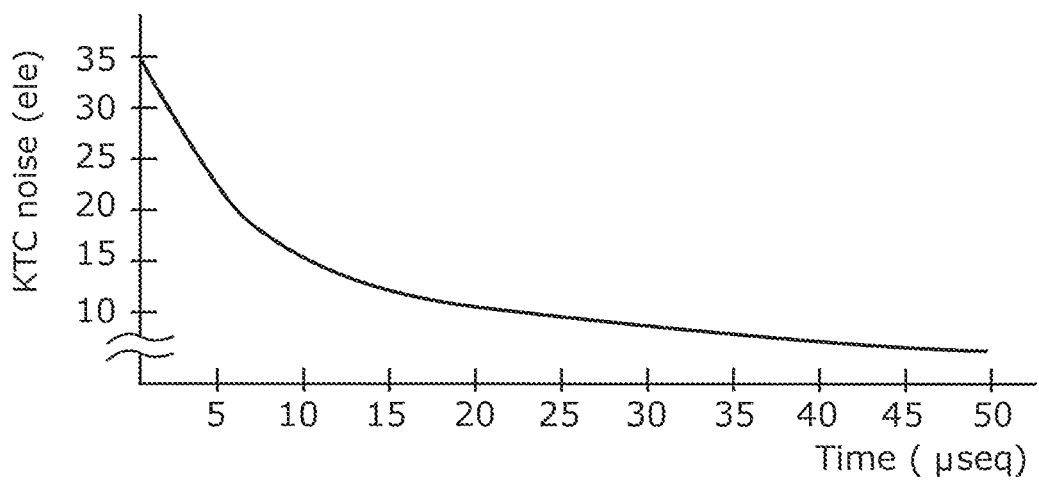
FIG. 5 is a graph depicting a relationship between a noise and pixel soft-reset signal taper time.

FIG. 5 is a graph depicting a relationship between a noise and a taper time of the pixel soft reset signal. The waveform of the pixel reset control signal 36 referred to as soft reset in the above description produces a more significant advantageous effect in noise reduction as the length of the period of the taper waveform is longer, as illustrated in FIG. 5.

Figure 6:
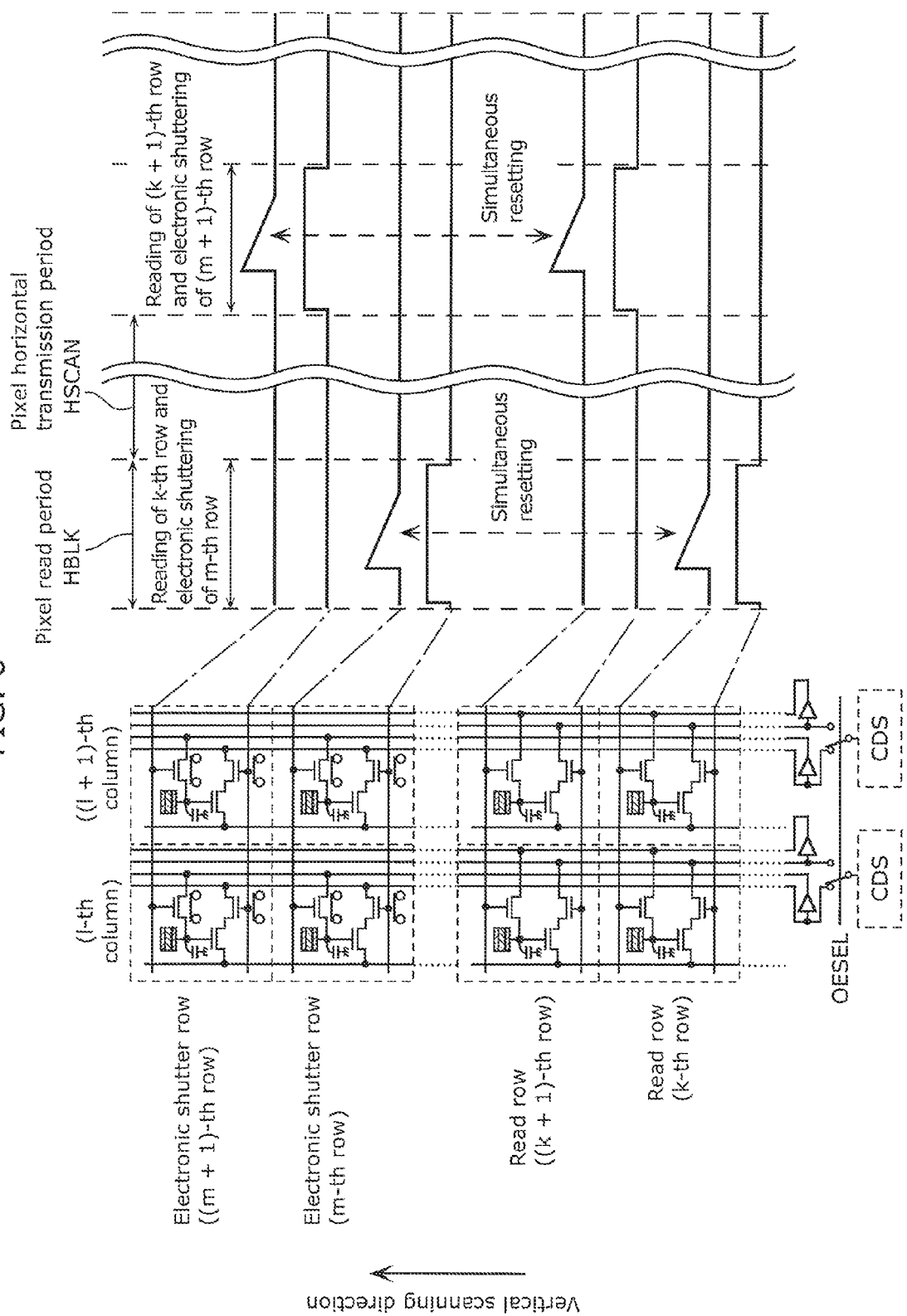
FIG. 6 is a schematic driving timing chart illustrating operation of the solid-state imaging device according to Embodiment 1.

FIG. 6 is a schematic driving timing chart illustrating operation of the solid-state imaging device according to Embodiment 1 of the present disclosure. In FIG. 6, when the read row is denoted as a k-th row and an electronic shutter row is denoted as an math row, the pixels in the k-th row are connected to the first column signal line 9, the first reset drain line 16, and the first feedback amplifier 44, and the pixels in the m-th row are connected to the second column signal line 60, the second reset drain line 61, and the second feedback amplifier 64. This allows the first feedback amplifier 44 and the second feedback amplifier 64 to operate in parallel, which makes it possible to simultaneously reset the k-th row and the math row. Such a configuration shortens the pixel read period.

In contrast, with a solid-state imaging device equipped with only one feedback amplifier for each row, although the kTC noise can be removed, since the k-th row and the m-th row cannot be reset simultaneously, the parallel operation cannot be performed and thus the read period cannot be shortened.

Figure 7:
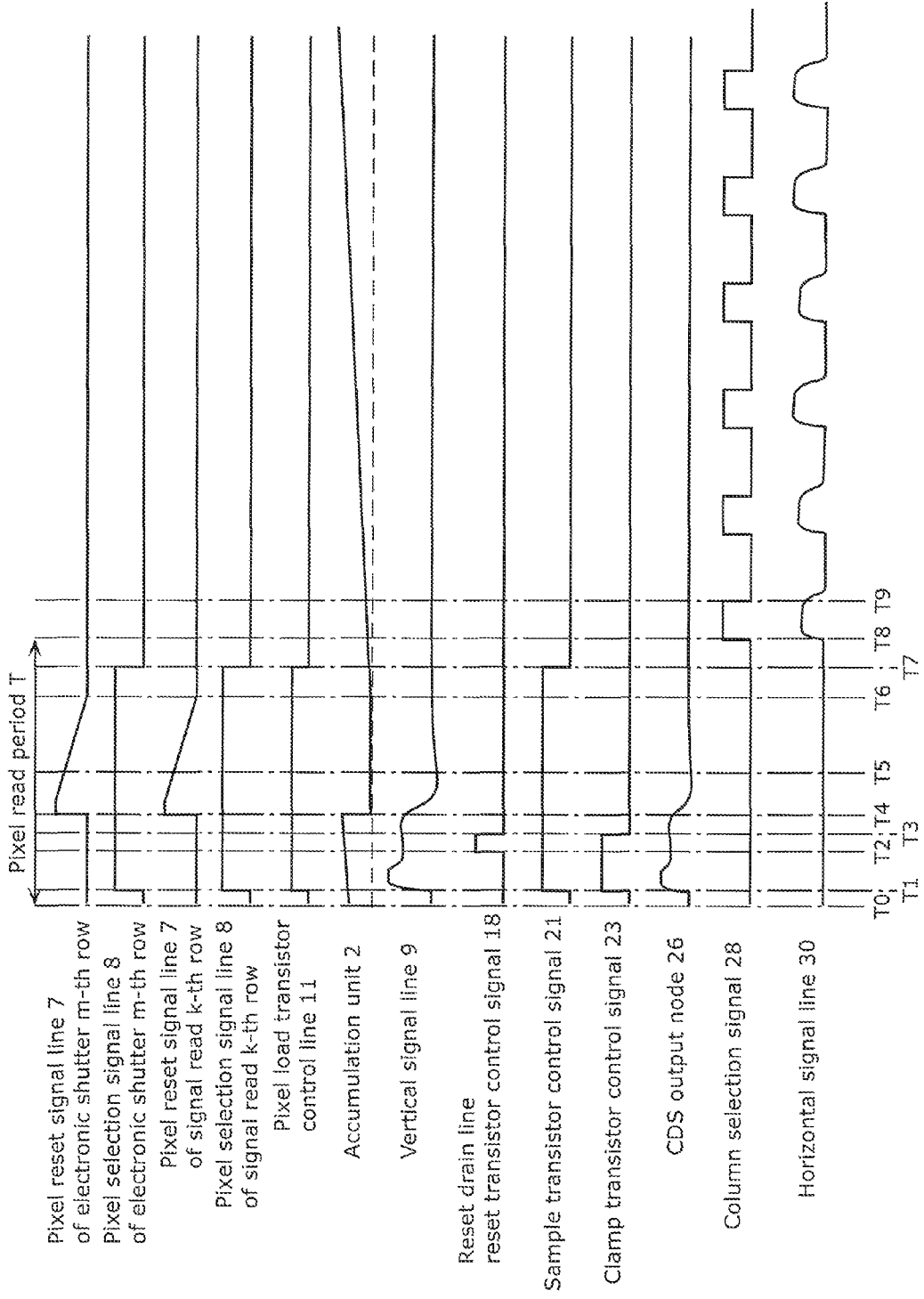
FIG. 7 is a detailed driving timing chart illustrating operation of the solid-state imaging device according to Embodiment 1.

FIG. 7 is a detailed driving timing chart illustrating operation of the solid-state imaging device according to Embodiment 1. In FIG. 7, although the photoelectric conversion unit 1, which is a layered film, converts the light into the electric signal S and the electric signal S is accumulated in the accumulation unit 2, since this is based on an assumption that the light is converted into a positive electric signal S, the potential in the accumulation unit 2 increases as the time elapses.

First, at a time point T1, potentials of pixel selection signal lines 8 at a k-th row which is a pixel signal read row and an m-th row which is an electronic shutter row are changed from low-level to high-level, and the selection transistor 5 is turned ON.

Furthermore, at the time point T1, the potential of the pixel load transistor control line 11 is increased from low-level to make the electric signal S impedance-converted by the source follower circuit and inputted to the CDS circuit 45 via the first column signal line 9. The source follower circuit includes the amplifying transistor 4 and one of the load transistors 10a and 10b.

Furthermore, at the time point T1, the sample transistor control signal 21 and the clamp transistor control signal 23 are changed from low-level to high-level, and the electric signal S is temporarily sampled and held by the CDS circuit 45.

Next, at a time point T2, the reset drain line reset transistor control signal 18 is changed from low-level to high-level, and the first reset drain line 16 and the second reset drain line 61 are temporarily set to an accumulation unit initialization voltage INIT.

Next, at a time point. T3, the reset drain line reset transistor control signal 18 and the clamp transistor control signal 23 are changed from high-level to low-level.

Next, at a time point T4, potentials of the pixel reset signal lines 7 of the k-th row and the m-th row are changed from low-level to high-level. Specifically, the reset transistor 3 in the first connection-type pixel 42 and the reset transistor 3 in the second connection-type pixel 70 are turned ON simultaneously.

After that, the potentials of the pixel reset signal lines 7 of the k-th row and the m-th row are gradually lowered towered low level in a tapered shape, to suppress the kTC noise. When the reset transistor 3 is turned ON, the electric signal S previously accumulated in the accumulation unit 2 is set to the accumulation unit initialization voltage INIT, and the potential of the accumulation unit 2 drops.

At this time, the signal inversely-amplified by the first feedback amplifier 44 returns to the accumulation unit 2 of the pixel 42 in the k-th row, and cancels the noise. In the same manner, the signal inversely-amplified by the second feedback amplifier 64 returns to the accumulation unit 2 of the pixel 70 in the m-th row, and cancels the noise.

Next, at a time point T5, the reset transistor 3 is turned OFF gradually and the soft resetting is completed.

Next, at a time point T6, potentials of the pixel reset signal lines of the k-th row and the m-th row are changed to low-level.

In a time period from the time point T4 to a time point T7, the electric signal N at the accumulation unit 2 of the k-th row after resetting is inputted to the CDS circuit 45 via the first column signal line 9. At the CDS circuit 45, the electric signal S and the electric signal N of the k-th row are differentiated, and the differential signal is output to the CDS output node 26 and dealt with as a pixel signal P.

Next, at the time point T7, the potentials of the pixel selection signal lines 8 of the k-th row and the m-th row and the potential of the pixel load transistor control line 11 are changed to low-level. Furthermore, the sample transistor control signal 21 is changed to low-level. Thus, the pixel signal P is accumulated in the capacitor 25.

This is the end of the pixel read period.

After the time point 18, the column selection transistor 27 is turned ON by the column selection signal 28 from the column scanning circuit 29, which causes the pixel signal P of the aforementioned k-th row to be read out to the horizontal signal line 30, amplified by the output amplifier 31, and output to the outside from the VOUT terminal 32.

Figure 8:
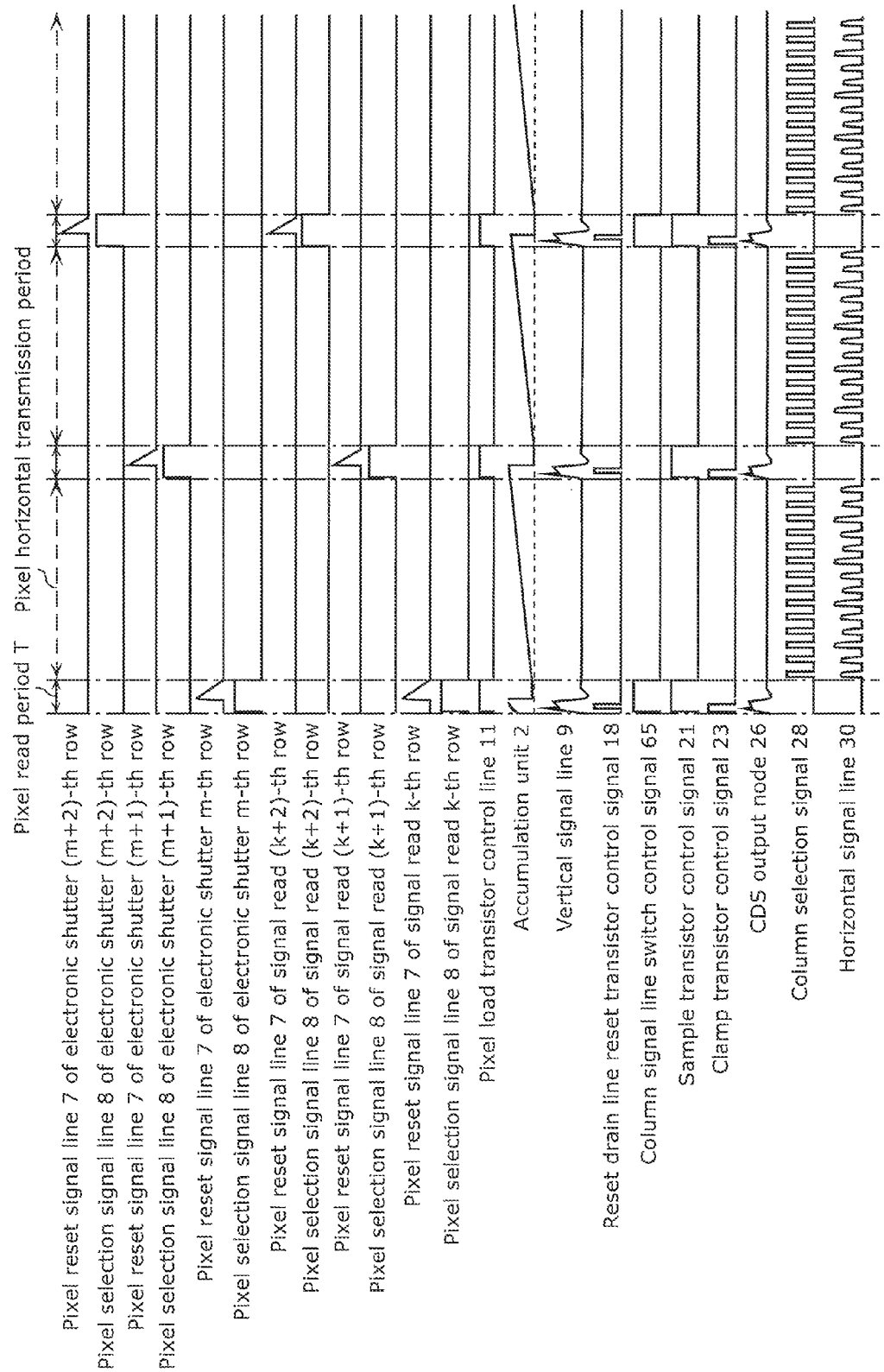
FIG. 8 is a driving timing chart, for three rows, illustrating operation of the solid-state imaging device according to Embodiment 1.

FIG. 8 is a driving timing chart, for three rows, illustrating operation of the solid-state imaging device according to Embodiment 1. The timing chart in FIG. 8 illustrates the timing chart in FIG. 7 for three rows, and includes signal reading from a k-th row to a (k+2)-th row and electronic shuttering from m-th row to a (m+2)-th row. In the solid-state imaging device equipped with only a single feedback amplifier for each row, it is required to perform signal reading on the k-th row and the resetting of the electronic shuttering on the m-th row in order, for example. In contrast, with the solid-state imaging device according to the present embodiment, the signal reading on the k-th row and the resetting of the electronic shuttering on the m-th row can be performed in parallel, thereby halving the pixel read period. Thus, it becomes easier to achieve the high-speed frame rate required for continuous image capturing or video capturing with higher pixel count.

Figure 9:
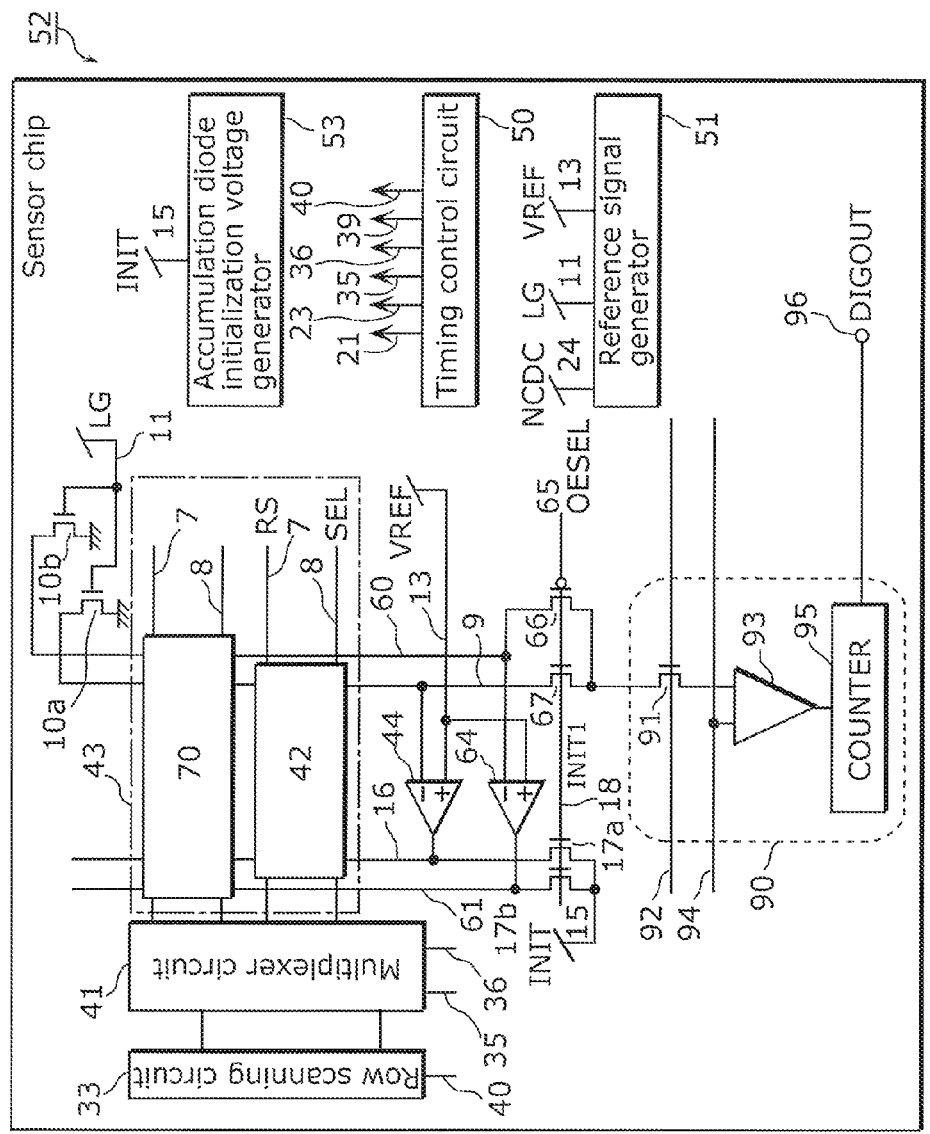
FIG. 9 is a diagram indicating circuit configurations of a pixel unit and an analogue-digital converter of the solid-state imaging device according to Embodiment 1.
Figure 10:
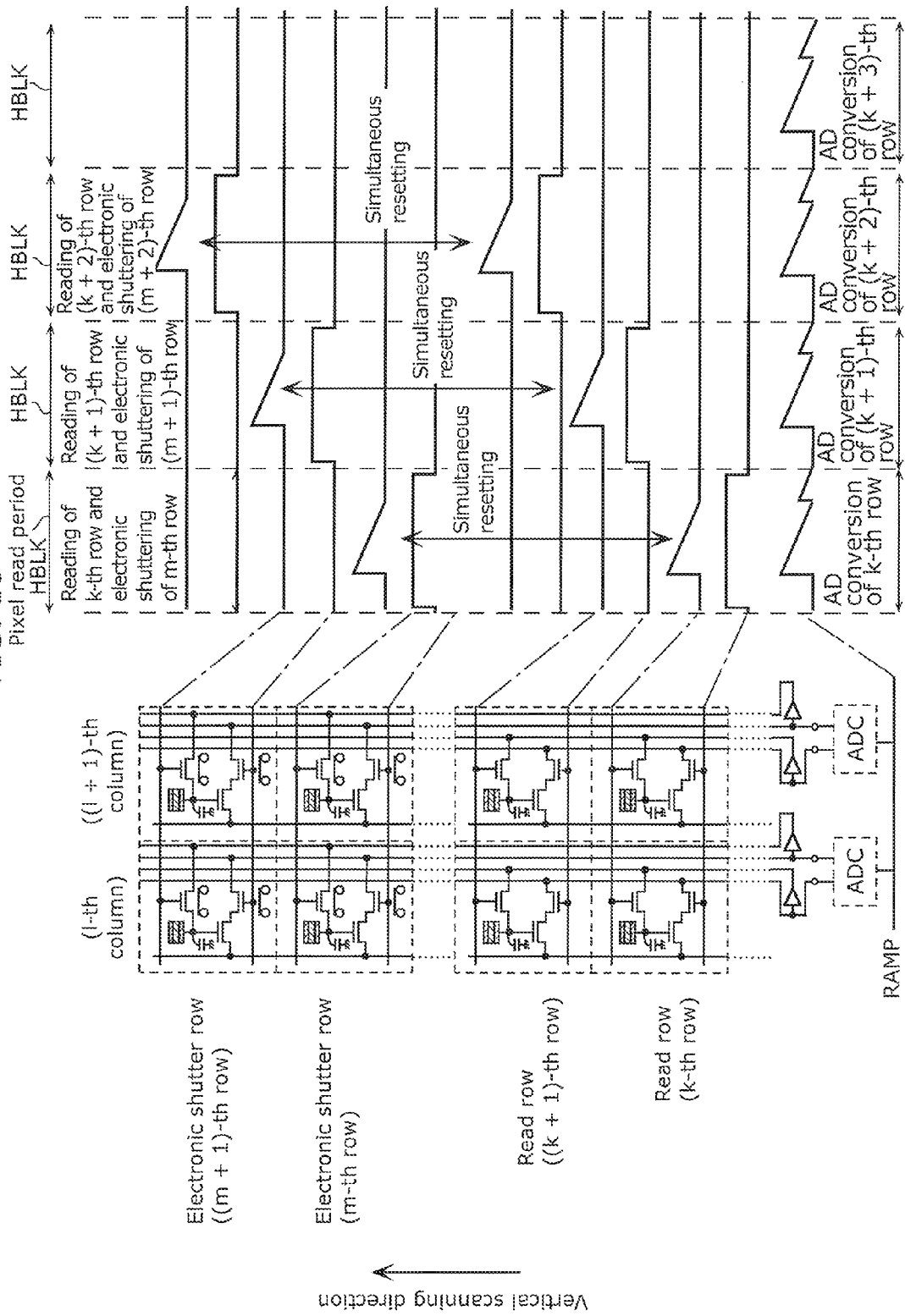
FIG. 10 is a schematic driving timing chart illustrating operation of the solid-state imaging device according to Embodiment 1 provided with the analogue-digital converter.

FIG. 9 is a diagram indicating circuit configurations of a pixel unit and an analogue-digital converter of the solid-state imaging device according to Embodiment 1. Furthermore, FIG. 10 is a schematic driving timing chart illustrating operation of the layered solid-state imaging device according to Embodiment 1 provided with the analogue-digital converter. FIG. 9 indicates a solid-state imaging device including an analogue-digital converter 90 connected to the first column signal line 9 and the second column signal line 60 for each row. Adopting this circuit configuration allows achieving a sequence in which the resetting and the AD conversion on the k-th row and the resetting on the m-th row are performed in parallel for each row, as illustrated in FIG. 10.

Figure 11:
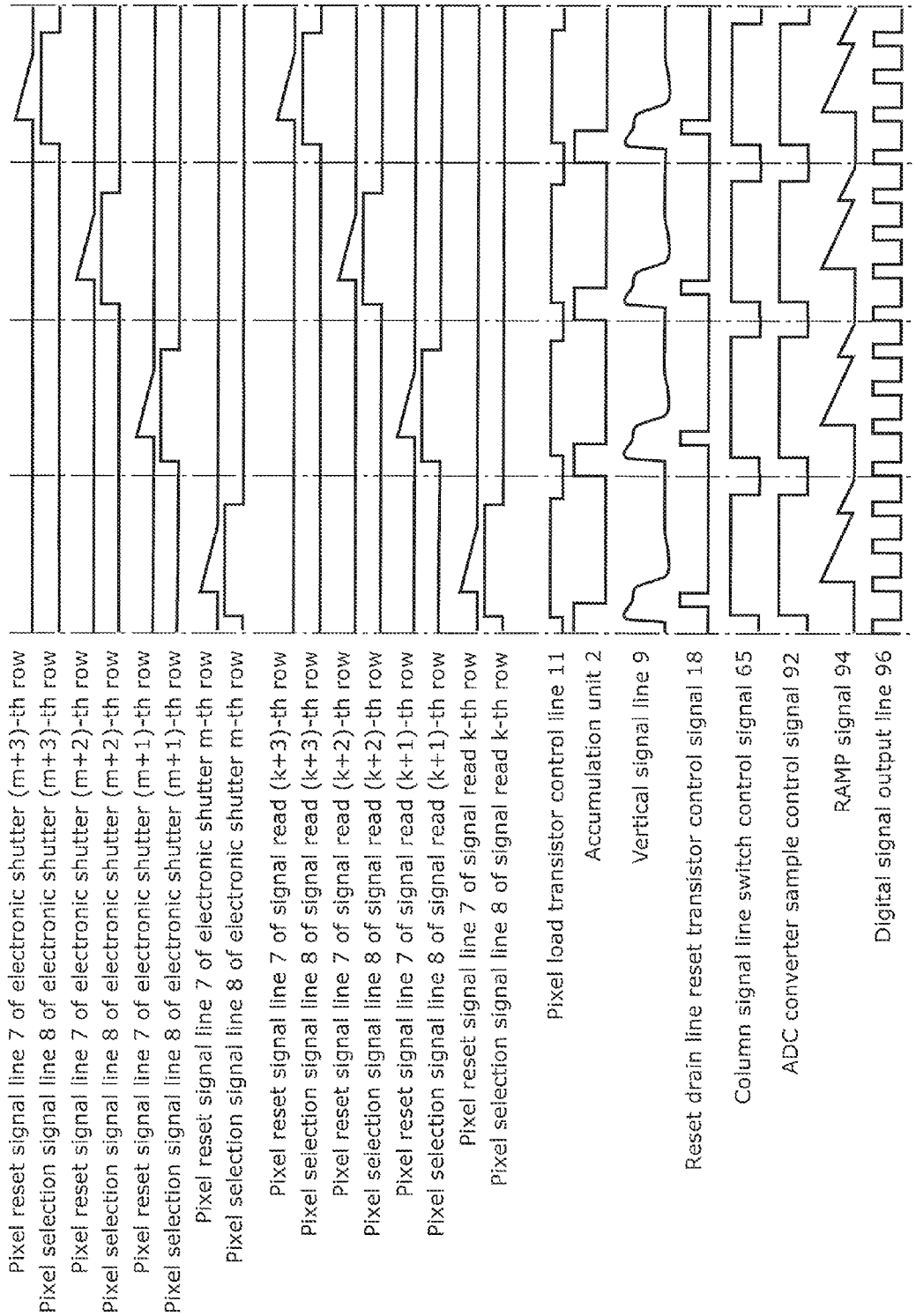
FIG. 11 is a detailed driving timing chart of the solid-state imaging device according to Embodiment 1 provided with the analogue-digital converter.

FIG. 11 is a detailed driving timing chart of the solid-state imaging device according to Embodiment 1 provided with the analogue-digital converter. The timing chart in FIG. 11 illustrates the timing chart in FIG. 10 for four rows, and includes signal reading from a k-th row to a (k+3)-th row and electronic shuttering from the m-th row to a (m+3)-th row. As illustrated in FIG. 11, output of digital signal is not interrupted even in the driving including continuous pixel read period. This makes it possible to achieve the high-speed frame rate required for continuous image capturing or video capturing with higher pixel count. In contrast, with the solid-state imaging device equipped with only one feedback amplifier for each row, the output of digital signal is interrupted since the resetting and the AD conversion on the m-th row cannot be performed during the resetting on the k-th row, for example.

Embodiment 2

Hereinafter, description is provided on a solid-state imaging device according to Embodiment 2.

Figure 12:
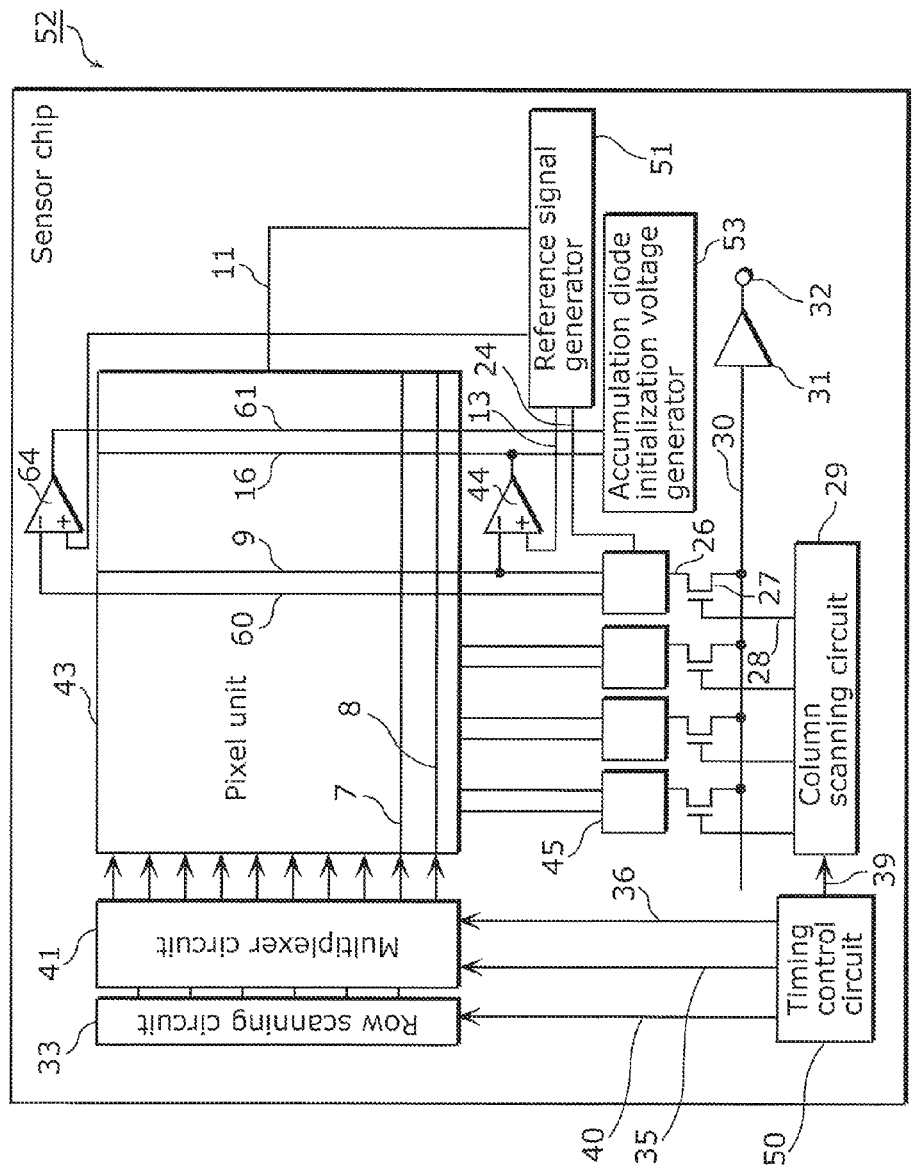
FIG. 12 is a diagram indicating a circuit configuration of a layered solid-state imaging device according to Embodiment 2.

FIG. 12 is a diagram indicating a circuit configuration of a layered solid-state imaging device according to Embodiment 2. The solid-state imaging device in FIG. 12 is different from the solid-state imaging device according to Embodiment 1 in FIG. 1 in that the arrangement positions of the feedback amplifiers are distributed to the above and below the pixel unit 43. In other words, when the pixel unit 43 includes n rows (n is an integer greater than or equal to 2), in a plan view, the second feedback amplifier 64 is arranged above the first row of the matrix of the plural pixels and the first feedback amplifier 44 is arranged below the n-th row of the matrix. In the present Description, "in a plan view" stands for looking from a normal direction of the light receiving surface of the photoelectric conversion unit 1, that is, looking at the solid-state imaging device from directly above.

With the above arrangement, the wiring connecting the pixel 42 and the first feedback amplifier 44 and the wiring connecting the pixel 70 and the second feedback amplifier 64 are split to above and below, which allows laying out the first column signal line 9 and the second column signal line 60 to the above and below of the pixel unit and laying out the first reset drain line 16 and the second reset drain line 61 to the above and below of the pixel unit. Therefore, the restriction on the wiring of the column circuit layout is alleviated, which is advantageous in miniaturization. Moreover, since the pixel unit can be arranged at the center of the sensor chip 52, there is another advantage of facilitating adjustment of lens positions when providing an image sensor to a miniature component such as a camera system such as a camera module.

It is to be noted that the first feedback amplifier 44 according to Embodiment 1 and the second feedback amplifier 64 according to Embodiment 2 may be of a double-input type and a single-input type.

Figure 13A:
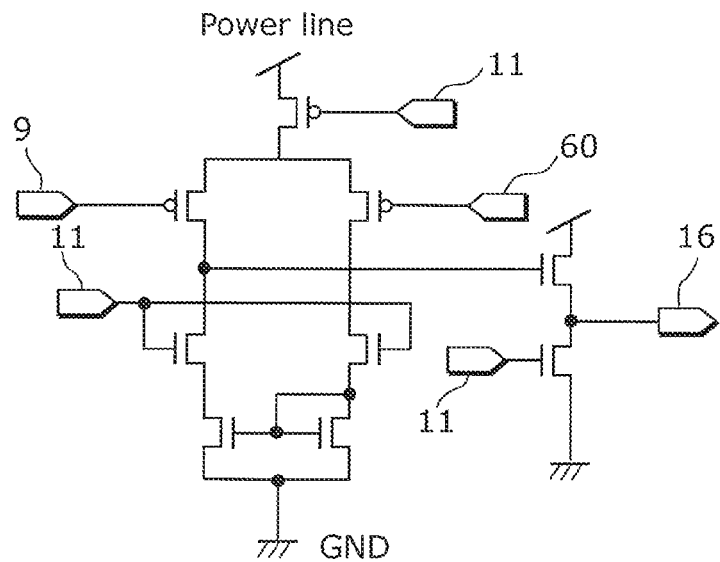
FIG. 13A is a diagram indicating a configuration of a double-input feedback amplifier circuit of the solid-state imaging device according to the present disclosure.
Figure 13B:
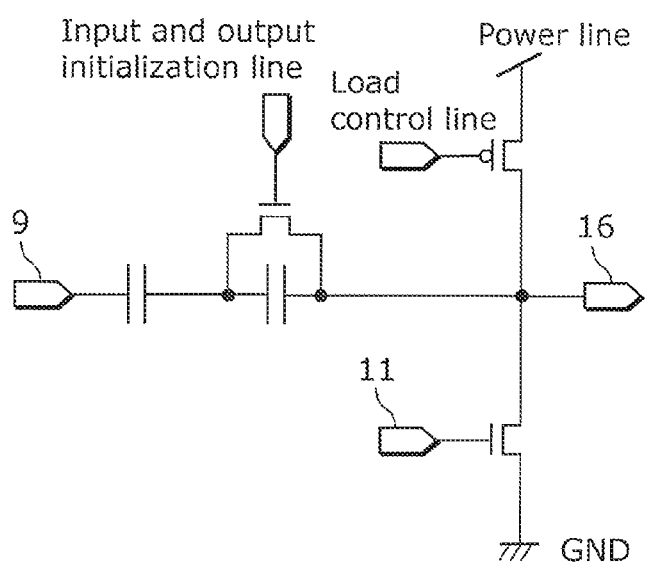
FIG. 13B is a diagram indicating a configuration of a single-input feedback amplifier circuit of the solid-state imaging device according to the present disclosure.

FIG. 13A is a diagram indicating a configuration of a double-input feedback amplifier circuit of the solid-state imaging device according to the present disclosure. FIG. 13B is a diagram indicating a configuration of a single-input feedback amplifier circuit of the solid-state imaging device according to the present disclosure. As illustrated in FIG. 13A, for the double-input feedback amplifier, a differential amplifier, an output buffer, and at least nine transistor elements for the circuit are generally required. In contrast, for the single-input feedback amplifier, the circuit can be achieved with at least three transistor elements, which is advantageous particularly for miniature layout.

As described above, with the solid-state imaging devices according to Embodiments 1 and 2, it becomes possible to provide a camera system which can achieve both a high image quality and a high-speed frame rate.

The above has described the solid-state imaging device according to the present disclosure based on Embodiments 1 and 2. However, the present disclosure is not limited to Embodiments 1 and 2. Although only some exemplary embodiments of the present disclosure have been described in detail above, those skilled in the art will readily appreciate that many modifications are possible in the exemplary embodiments without materially departing from the novel teachings and advantages of the present disclosure. Moreover, constituent elements in the embodiments may be optionally combined without departing from the spirit of the prevent disclosure.

The solid-state imaging device according to the foregoing embodiments is typically implemented as a large-scale integration (LSI) circuit, which is an integrated circuit. These may be integrated into separate chips, or some or all of them may be integrated into a single chip.

The integration may be achieved, not only as an LSI but also as a dedicated circuit or a general purpose processor. A field programmable gate array (FPGA) which can be programmed after LSI manufacturing or a reconfigurable processor in which the connection or setting of the circuit cell inside the LSI can be reconfigured may be used.

In the foregoing cross-sectional views, the corner and the side of each constituent element are drawn linearly, but the constituent elements having round corners and curved sides in terms of the manufacturing process are also included in the present disclosure.

At least part of functions of the solid-state imaging device according to the foregoing embodiments may be combined.

All the figures used above are provided for purposes of illustration of the present disclosure, and the present disclosure is not limited to these figures.

In the foregoing description, MOS transistors are used as examples, but other transistors are also possible.

Various modifications to the embodiments that can be conceived by those skilled in the art which are within the teachings of the present disclosure may be included in the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The solid-state imaging device according to the present disclosure is effective for use in a miniaturized, thin, and high-sensitivity image pickup device and so on.

The invention claimed is:
1. A solid-state imaging device comprising:
a pixel unit including a plurality of pixels arranged in a matrix;
a first column signal line and a second column signal line which are provided for each column of the pixel unit;
a first reset drain line and a second reset drain line which are provided for each column of the pixel unit;
a first feedback amplifier which is provided for each column of the pixel unit and connected to the first column signal line as an input line and the first reset drain line as an output line; and
a second feedback amplifier which is provided for each column of the pixel unit and connected to the second column signal line as an input line and the second reset drain line as an output line, wherein the pixel unit includes:
a first connection-type pixel connected to the first feedback amplifier; and
a second connection-type pixel connected to the second feedback amplifier,
the first connection-type pixel includes a reset transistor having a source and a drain one of which is connected to the first reset drain line,
the second connection-type pixel includes a reset transistor having a source and a drain one of which is connected to the second reset drain line,
the first connection-type pixel includes an amplifying transistor having a source and a drain one of which is connected to the first column signal line, and
the second connection-type pixel includes an amplifying transistor having a source and a drain one of which is connected to the second column signal line.

2. The solid-state imaging device according to claim 1, wherein the first feedback amplifier and the second feedback amplifier operate in parallel.

3. The solid-state imaging device according to claim 1, wherein the pixel unit has n rows where n is an integer greater than or equal to 2, and
in a plan view, the first feedback amplifier is formed below a first row of the pixel unit and the second feedback amplifier is arranged above an n-th row of the pixel unit.

4. The solid-state imaging device according to claim 1, wherein the first feedback amplifier and the second feedback amplifier are of a single-input type.

5. The solid-state imaging device according to claim 1, further comprising
an analogue-digital converter for each column of the pixel unit,
wherein the analogue-digital converter is connected to the first column signal line and the second column signal line.

6. The solid-state imaging device according to Claire 1, further comprising:
a photoelectric conversion unit configured to convert light into a signal charge; and
accumulation units configured to accumulate the signal charge,
wherein the amplifying transistor included in the first connection-type pixel and the amplifying transistor included in the second connection-type pixel have gates each of which are connected to each of the accumulation units, and
an other of the source and the drain of the reset transistor included in the first connection-type pixel and an other of the source and the drain of the reset transistor included in the second connection-type pixel are each connected to each of the accumulation units.

7. The solid-state imaging device according to claim 1, wherein the reset transistor included in the first connection-type pixel and the reset transistor included in the second connection-type pixel are turned ON simultaneously.

\* \* \* \* \*